(12) United States Patent
Kim et al.

(10) Patent No.: US 8,767,401 B2
(45) Date of Patent: Jul. 1, 2014

(54) INVERTER STACK

(75) Inventors: Jungbum Kim, Seoul (KR); Namsik Yim, Seoul (KR); Hyeokjin Song, Seoul (KR); Beomseok Lee, Seoul (KR); Seunghee Ryu, Seoul (KR); Dongcheol Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 356 days.

(21) Appl. No.: 13/226,043

(22) Filed: Sep. 6, 2011

(65) Prior Publication Data

US 2012/0162912 A1 Jun. 28, 2012

(30) Foreign Application Priority Data

Dec. 24, 2010 (KR) .................. 10-2010-0134887

(51) Int. Cl.
*H05K 7/20* (2006.01)
(52) U.S. Cl.
USPC .......................................................... 361/697
(58) Field of Classification Search
CPC ................................................ H05K 7/20918
USPC ........................................ 361/688–695, 697
See application file for complete search history.

(56) References Cited

U.S. PATENT DOCUMENTS

| | | | |
|---|---|---|---|
| 4,459,638 A * | 7/1984 | Brehm et al. ................ | 361/697 |
| 4,520,425 A | 5/1985 | Ito | |
| 5,091,823 A * | 2/1992 | Kanbara et al. ............... | 361/697 |
| 5,930,112 A * | 7/1999 | Babinski et al. .............. | 361/695 |
| 6,621,700 B1 * | 9/2003 | Roman et al. ................. | 361/697 |
| 6,657,320 B1 | 12/2003 | Andrews et al. | |
| 7,042,745 B1 * | 5/2006 | Chen ............................ | 363/144 |
| 7,715,195 B2 * | 5/2010 | Bremicker et al. ........... | 361/714 |
| D629,383 S * | 12/2010 | Quilter et al. ................ | D14/188 |
| 2004/0109293 A1 * | 6/2004 | Apfelbacher et al. ........ | 361/709 |
| 2004/0223301 A1 | 11/2004 | Muller et al. | |
| 2005/0265002 A1 | 12/2005 | Armstrong et al. | |
| 2008/0304235 A1 * | 12/2008 | Kunkle ......................... | 361/697 |
| 2010/0079944 A1 * | 4/2010 | Loth ............................. | 361/695 |

FOREIGN PATENT DOCUMENTS

| | | |
|---|---|---|
| JP | 60-180484 A | 9/1985 |
| KR | 20-0128200 Y1 | 8/1998 |
| KR | 2003-0025426 A | 3/2003 |
| KR | 10-1004732 B1 | 12/2010 |

* cited by examiner

*Primary Examiner* — Adrian S Wilson
(74) *Attorney, Agent, or Firm* — McKenna Long & Aldridge LLP

(57) ABSTRACT

An inverter stack includes an enclosure on which an inlet port is formed at a lower end thereof and an outlet port is formed at an upper end thereof, the enclosure defining an internal space, a heat sink having a switching element, disposed within an upper region of the internal space, and a plurality of DC-link capacitors disposed within the internal space and below the heat sink. Through this, heat generated in high heat dissipation components is immediately moved upward by convection, thereby suppressing the damage of components due to high temperature.

12 Claims, 7 Drawing Sheets

INVERTER STACK

CROSS-REFERENCE TO RELATED APPLICATIONS

The present disclosure relates to subject matter contained in priority Korean Application No. 10-2010-0134887, filed on Dec. 24, 2010, which is herein expressly incorporated by reference in its entirety.

BACKGROUND OF THE INVENTION

1. Field of the Invention

The present disclosure relates to an inverter stack, and more particularly, to an inverter stack for suppressing an adverse effect on due to high temperature by improving its cooling performance.

2. Description of the Related Art

As is generally known, an inverter or inverter stack is an apparatus for converting direct-current power to high-frequency alternate-current power.

Such an inverter stack is widely used in driving a high-frequency induction heater or three-phase AC motor for heating metal or the like using high-frequency power.

The inverter stack may include an enclosure forming an accommodation space therein, and a circuit unit (inverter) having a switching element disposed at an inner portion of the enclosure to switch direct-current power to output high-frequency power, and a cooling unit dissipating heat generated by the circuit unit for cooling.

However, in the inverter stack in the related art, a circuit unit is provided without taking sufficient consideration on the heating relations of components, thereby accelerating the enforced deterioration of peripheral components due to heat generated by high heat dissipation components. In particular, for other components disposed adjacent to high-temperature heat dissipation components, it may cause life reduction and/or performance degradation due to high heat directly transferred from the high heat dissipation components.

Furthermore, when high heat dissipation components are disposed far apart from an outlet port without taking sufficient consideration on the heating relations of components, the dissipation of heat generated from the high heat dissipation components is delayed, thereby increasing an internal temperature of the enclosure.

Taking such points into consideration, when the capacity of a cooling apparatus is increased, it may increase the consumption power of the cooling apparatus, thereby increasing the size of an overall device as well as raising the production cost.

SUMMARY OF THE INVENTION

In order to solve the foregoing problem, one aspect of the detailed description is to provide an inverter stack capable of suppressing the damage of components due to high temperature.

Furthermore, another aspect of the present disclosure is to provide an inverter stack capable of shortening the path of heat dissipation to suppress temperature increase.

In addition, still another aspect of the present disclosure is to provide an inverter stack capable of reducing the capacity of a cooling apparatus to decrease the overall size of a device as well as reduce the production cost.

In order to accomplish the foregoing objectives of the present invention, there is provided an inverter stack including an enclosure on which an inlet port is formed at a lower end thereof and an outlet port is formed at an upper end thereof, the enclosure defining an internal space; a heat sink having a switching element, disposed within an upper region of the internal space; and a plurality of DC-link capacitors disposed within the internal space and below the heat sink.

Here, the heat sink may partition the internal space of the enclosure to form an air passage through which the air drawn in from the inlet port flows to the outlet port.

The inverter stack may further include a bus plate disposed at a side of the DC-link capacitors to extend the partition of the internal space of the enclosure to extend the air passage in cooperation with the heat sink.

The inverter stack may further include a reactor disposed above the DC-link capacitors within the air passage.

The heat sink may include a heat-dissipating plate and a plurality of heat-dissipating fins protruded from one side surface of the heat-dissipating plate and separately disposed in parallel to one another, and the heat-dissipating plate may partition the internal space of the enclosure in a frontward and rearward direction to form the air passage.

The heat-dissipating fins may be disposed within the air passage, and the switching element may be provided at the other side surface of the heat-dissipating plate.

The inverter stack may further include a cooling fan configured to draw in air from the inlet port and discharge the air from the outlet port.

The cooling fan may be disposed at the outlet port.

The DC-link capacitors may be vertically disposed in a row.

On the other hand, according to another field of the present invention, there may be provided an inverter stack including an enclosure on which an inlet port is formed at a lower end thereof and an outlet port is formed at an upper end thereof, the enclosure defining an internal space; a heat sink having a switching element, the heat sink oriented to partition the internal space of the enclosure to form an air passage within the enclosure; a plurality of DC-link capacitors disposed within the internal space and below the heat sink; a bus plate disposed below the heat sink to extend the air passage in cooperation with the heat sink; and a cooling fan disposed at the outlet port.

Here, the switching element may include an insulated gate bipolar transistor.

The heat sink may include a heat-dissipating plate and a plurality of heat-dissipating fins protruded from the heat-dissipating plate, and the bus plate may be disposed to be extended downward at a lower side of the heat sink.

The heat-dissipating plate and heat-dissipating fins can be separated from and assembled with one another.

The inverter stack may further include a reactor disposed above the DC-link capacitors within the air passage.

The DC-link capacitors may be vertically disposed in a row.

On the other hand, according to still another field of the present invention, there may be provided an inverter stack including an enclosure on which an inlet port is formed at a lower end thereof and an outlet port is formed at an upper end thereof, the enclosure defining an internal space; a heat sink having a switching element, the heat sink oriented to partition the internal space of the enclosure to form an air passage within the enclosure; a bus plate disposed below the heat sink to extend the air passage in cooperation with the heat sink; a reactor disposed above the bus plate within the air passage; and a plurality of DC-link capacitors disposed below the heat sink and the reactor within the air passage.

The heat sink includes a heat-dissipating plate and a plurality of heat-dissipating fins protruded from one side surface of the heat-dissipating plate, and the heat-dissipating plate may be extended downward from an upper plate of the enclosure to partition the internal space of the enclosure in a frontward and rearward direction.

The bus plate may be disposed below the heat-dissipating plate, and a lower end of the bus plate may contact a bottom plate of the enclosure.

A cooling fan may provided at the outlet port.

The DC-link capacitors may be vertically disposed in a row.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, the present invention will be described in detail with reference to the accompanying drawings.

Figure 1:
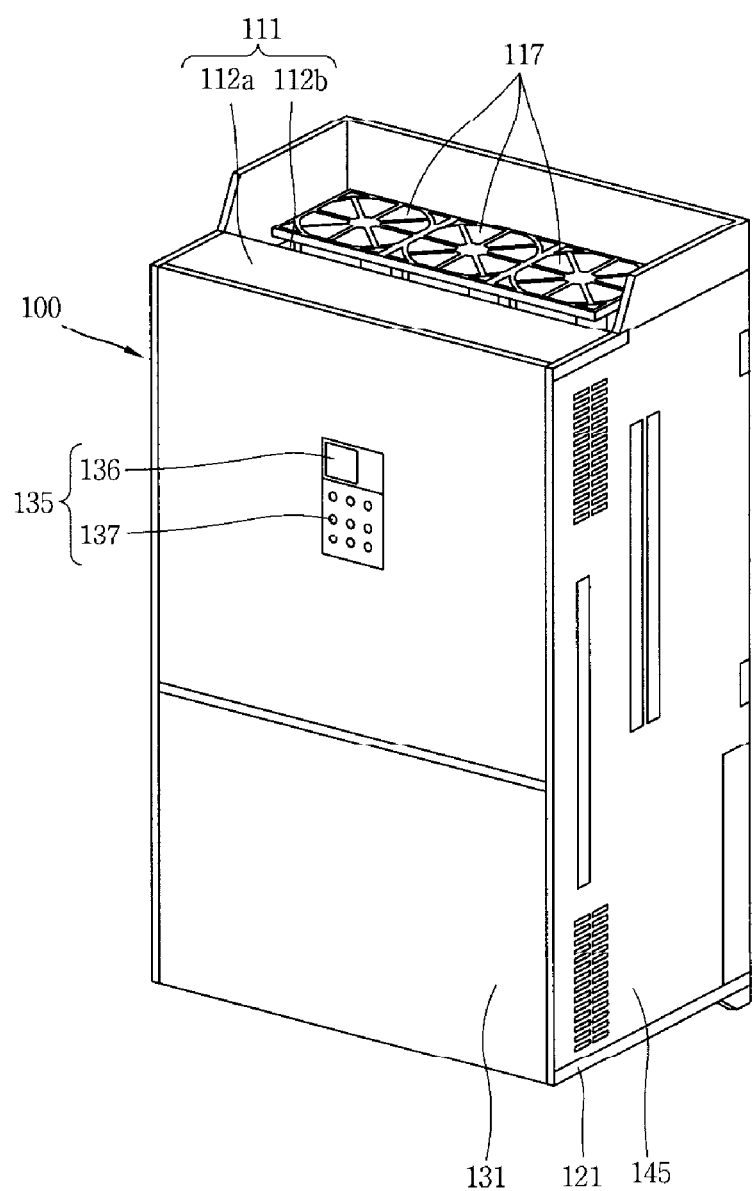
FIG. 1 is a perspective view illustrating an inverter stack according to an embodiment of the present invention.

As illustrated in FIG. 1, an inverter stack according to an embodiment of the present disclosure may include an enclosure 100 on which an inlet port 122 is formed at a lower end thereof and an outlet port 115 is formed at an upper end thereof; a heat sink 150 having a switching element 162d, disposed at an internal upper region of the enclosure 100; and a plurality of DC-link capacitors 171 disposed at a lower side of the heat sink 150.

The enclosure 100 may be configured with a rectangular parallelepiped formed with an accommodation space therein.

The enclosure 100 may be formed to have a long vertical length.

The enclosure 100 may include a bottom plate 121 disposed at a bottom portion thereof, an upper plate 111 disposed at an upper side of the bottom plate 121 to be separated therefrom by a predetermined distance, a front surface plate 131, a rear surface plate 141, and both lateral surface plates 145 disposed to block a lateral portion of the bottom plate 121 and upper plate 111.

The upper plate 111 may include a front upper plate 112a and a rear upper plate 112b disposed in a forward and backward direction. The front upper plate 112a and rear upper plate 112b may be disposed to be separated to each other in an upward and downward direction with a different height. The rear upper plate 112b may be disposed at a lower position than that of the front upper plate 112a. A connecting plate 112c may be provided between the front upper plate 112a and the rear upper plate 112b. The connecting plate 112c is extended downward at a rear edge of the front upper plate 112a to be connected to a front edge of the rear upper plate 112b.

An outlet port 115 may be formed at the rear upper plate 112b. The outlet port 115 may be provided with a plural number (three). A cooling fan 117 may be provided at the outlet port 115. A plurality of cooling fans 117 may be configured to be disposed at each of the outlet ports 115, respectively. The cooling fan 117 may be configured with an axial fan (propeller fan). The cooling fan 117 may include a plurality of blades 118, and a motor for rotating the blades 118.

Here, the both lateral surface plates 145 and rear surface plate 141 may be configured by including upper end portions further protruded by a predetermined length to an upper side of the upper plate 111. Through this, the air discharged from the outlet port 115 may be guided to be discharged to an upper side thereof without being spread to its surroundings.

A manipulation panel 135 for operation manipulation may be provided at the front surface plate 131. The manipulation panel 135 may be provided by including a display 136 for displaying certain information and a signal input unit 137 for receiving signals.

Figure 7:
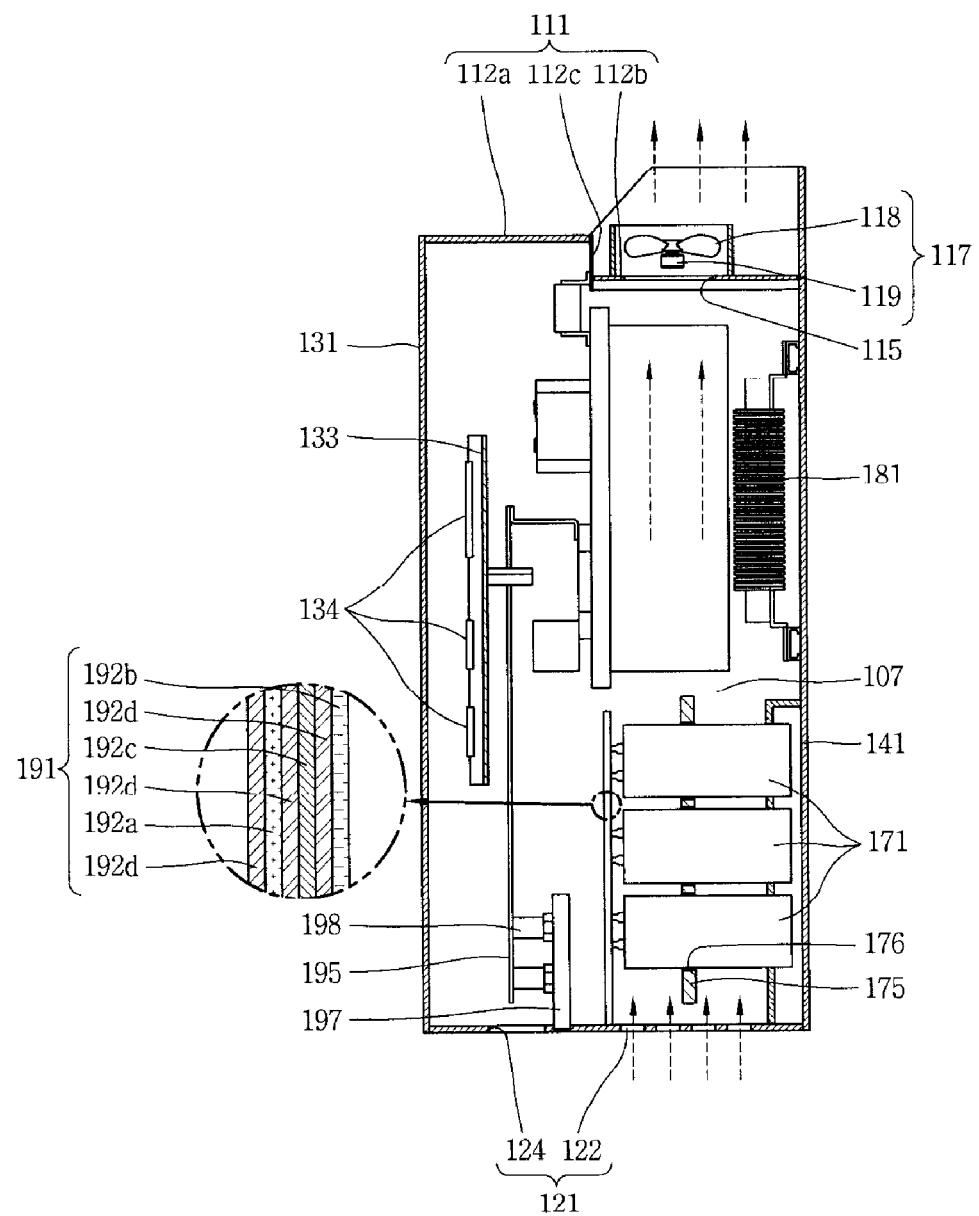
FIG. 7 is a longitudinal cross-sectional view illustrating the inverter stack in FIG. 1.

A PCB 131 having a control program may be provided at a rear surface of the front surface plate 131 as illustrated in FIG. 7. A plurality of PCBs 134 may be configured thereon. The PCB 134 may be supported by a PCB supporting structure 133. The PCB supporting structure 133 may be fixed to the both lateral surface plates 145.

An inlet port 122 may be formed at the bottom plate 121. The inlet port 122 may be disposed at a rear region along the forward and backward direction of enclosure 100. An insertion port 124 may be penetrated and formed at the bottom plate 121 to allow input and output power cables (not shown) to be inserted. The insertion port 124 may be disposed at a front side of the inlet port 122 to be separated therefrom by a predetermined distance.

A heat sink 150 may be disposed at an internal upper region of the enclosure 100.

The 150 may be disposed at a lower side of the rear upper plate 112b.

The heat sink 150 may be disposed at a vertical lower side of the outlet port 115 formed at the rear upper plate 112b. Through this, the heat of the heat sink 150 immediately passes through the outlet port 115 to be discharged to the outside of the enclosure 100 without being spread to its surroundings. Accordingly, it may be possible to suppress an internal temperature of the enclosure 100 from being increased.

The heat sink 150 may be configured by including a rectangular plate-shaped heat-dissipating plate 151, and a plurality of heat-dissipating fins 155 protruded at a surface of the heat-dissipating plate 151. Through this, the heat radiation area will be increased to accelerate the heat radiation of the heat-dissipating plate 151.

The heat sink 150 may be configured such that the heat-dissipating fins 155 can be separated and assembled with respect to the heat-dissipating plate 151. A plurality of insertion grooves (not shown) may be formed at the heat-dissipating plate 151 to allow the heat-dissipating fins 155 to be inserted.

The heat-dissipating plate 151 may be formed to have a same width as the inner width of the enclosure 100. More specifically, the heat-dissipating plate 151 may be configured to have a width allowing both lateral portions thereof to be brought into contact with the inner surface of the both lateral surface plates 145, respectively. Both sides of the heat-dissipating plate 151 may be fixed to the lateral surface plates 145.

The heat-dissipating fins 155 may be disposed at one surface of the heat-dissipating plate 151 to be protruded by a predetermined distance and separated in parallel to one another at regular intervals. The heat-dissipating fins 155 may be disposed along a upward and downward direction of the enclosure 100.

Figure 2:
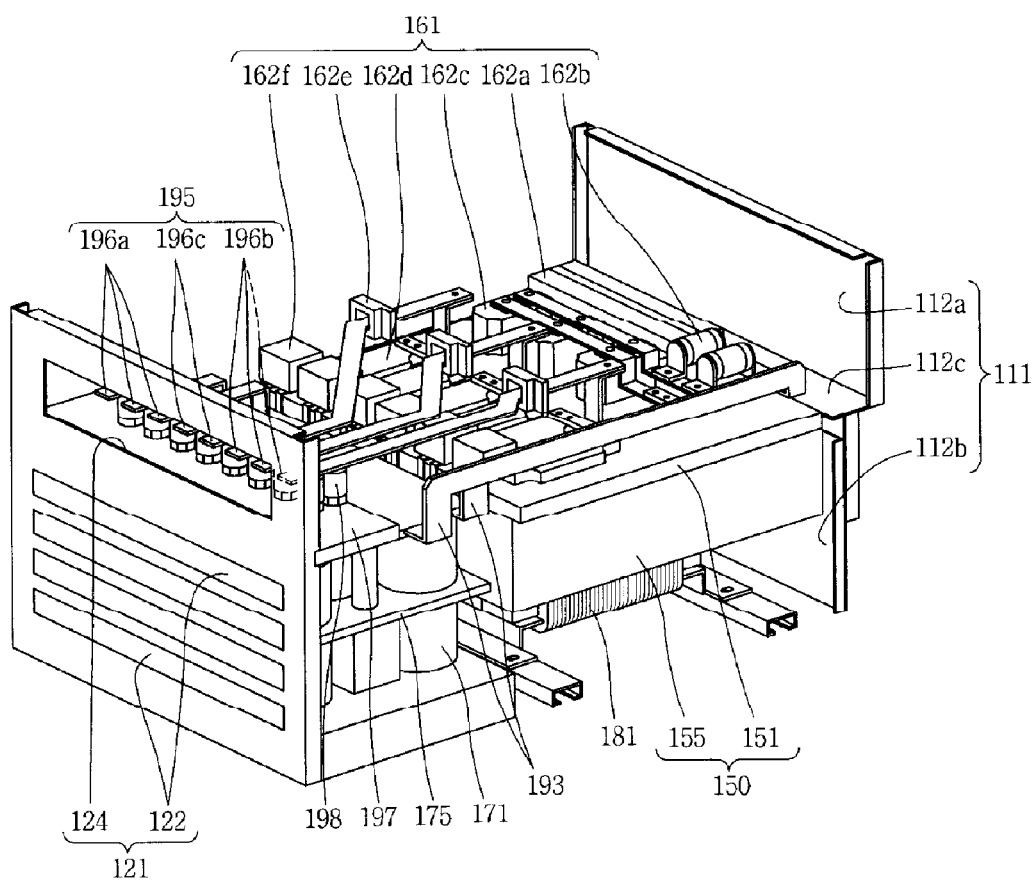
FIG. 2 is a perspective view illustrating an inverter stack of FIG. 1.
Figure 4:
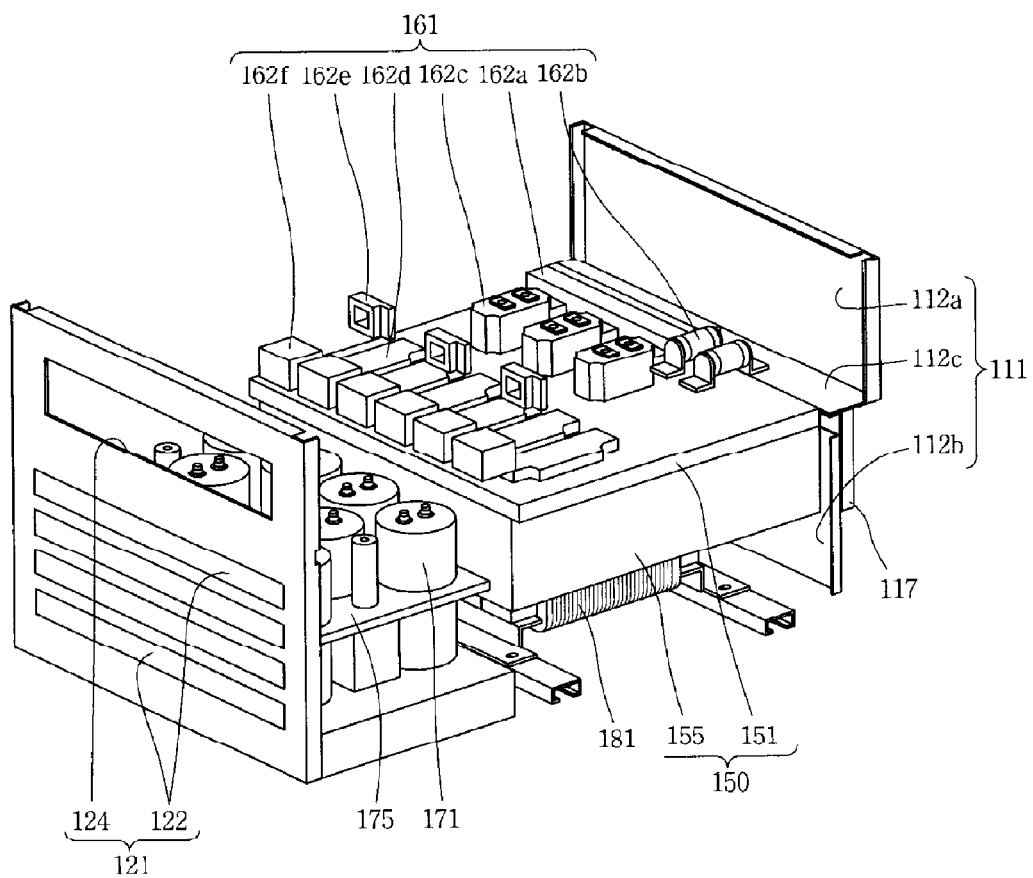
FIG. 4 is a perspective view illustrating a case where a bus bar and a bus plate of FIG. 2 are removed.

On the other hand, as illustrated in FIGS. 2 and 4, circuit element 161 including a plurality of switching elements 162d may be mounted on the heat-dissipating plate 151.

The circuit element 161 may include resistors 162a, fuses 162b, silicon controller rectifier (SCR)/diode modules 162c, insulated gate bipolar transistors (IGBTs) 162d for converting direct current to alternate current, current transducers (CTs) 162e for detecting an output current, snubbers 162f for suppressing a spike voltage generated during switching, and the like.

The switching element 162d may be configured with an insulated gate bipolar transistor (IGBT) 162d capable of high-speed switching. The insulated gate bipolar transistor (IGBT) 162d switches direct current provided from the DC-link capacitors 171 to output a three-phase alternate current.

The heat sink 150 may be disposed to partition an internal space of the enclosure 100 in a forward and backward direction. More specifically, the heat sink 150 may be disposed such that the heat-dissipating plate 151 is separated from the front surface plate 131 by a predetermined distance in a backward direction and extended downward from the upper plate 111 (rear upper plate 112b). Through this, it may be possible to partition the internal space of the enclosure 100 into two spaces along the forward and backward direction.

The above two spaces may be a circuit element chamber 102 formed at a front side of the heat sink 150 and an air passage 104 formed at a rear side of the heat sink 150.

The heat-dissipating fins 155 are placed on the air passage 104, and thus the heat sink 150 is brought into contact with the air being flowed in an upward direction to accelerate heat radiation.

A plurality of DC-link capacitors 171 may be disposed at a lower side of the heat sink 150. Through this, it may be possible to suppress the heat generated from the heat sink 150 having a relatively larger heat radiation amount from being transferred to the DC-link capacitors 171.

More specifically, the temperature of the heat sink 150 increases by the switching element 162d such as an insulated gate bipolar transistor having a large heat radiation amount. At this time, the heat dissipated from the heat sink 150 is moved to an upper side by convection, thereby effectively suppressing the heat from being transferred to the DC-link capacitors 171 disposed at a lower side thereof.

On the other hand, the number of the DC-link capacitors 171 may be configured with ten.

Figure 5:
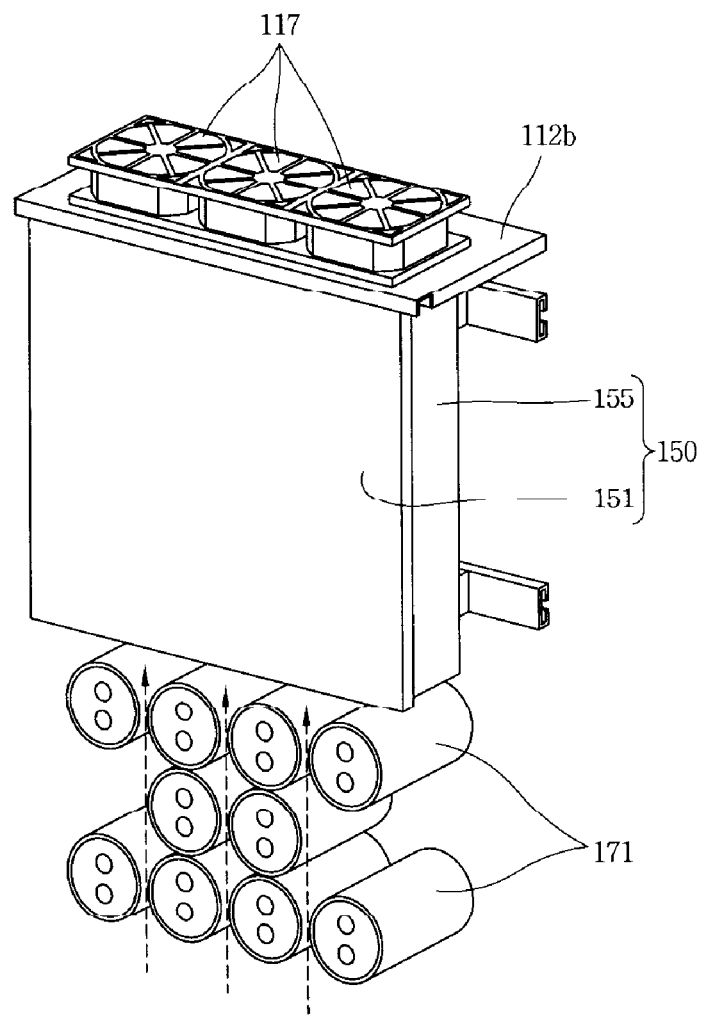
FIGS. 5 and 6 are perspective views illustrating a front surface and a rear surface of the heat sink in FIG. 2, respectively.
Figure 6:
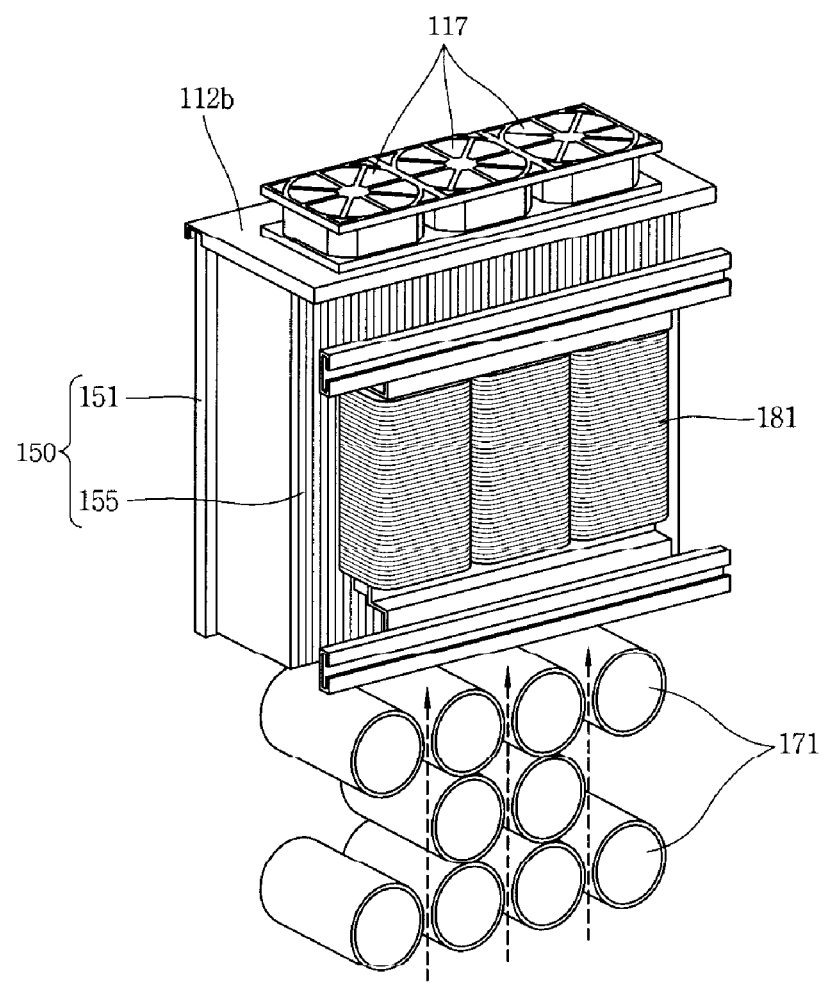

As illustrated in FIGS. 5 and 6, the DC-link capacitors 171 may be vertically disposed in a row. Through this, the flow of the air inhaled from the inlet port 122 to be flowed upward and discharged through the outlet port 115 may be accelerated. Furthermore, the flow speed of the air within the enclosure 100 is generally increased, thereby swiftly cooling a inner portion of the enclosure 100.

The DC-link capacitors 171 may be disposed to be separated from one another to form rows in the left and right direction and the upward and downward direction, respectively. In this embodiment, it is illustrated that four capacitors are disposed at the upper row, two capacitors at the central row located thereunder, and four capacitors at the lower row thereunder to be separated from one another in the left and right direction.

The central region of the DC-link capacitors 171 may be supported by a DC-link capacitor supporting structure 175. The DC-link capacitor supporting structure 175 may include a plurality of receiving holes 176 penetrated therethrough, which form rows in the left and right direction and the upward and downward direction to accommodate the DC-link capacitors 171 as described above.

As illustrated in FIGS. 6 and 7, reactors 181 may be provided at an upper region within the enclosure 100. The reactors 181 may be fixed to a rear surface plate of the rear surface plate 141.

The reactors 181 may be configured with three to correspond to each phase of alternate current, The reactors 181 may be disposed at one side of the heat sink 150, more particularly, at an air passage 104 in the rear region. The reactors 181 may be disposed at an upper region within the enclosure 100 since it radiates relatively a lot of heat during the operation. Through this, the discharge path (distance) of the heat in the reactor 181 may be shortened to accelerate the heat radiation of the reactor 181.

The reactors 181 may be provided in proximity to the outlet port 115. Through this, the heat dissipated during the working of the reactor 181 may be flowed upward by convection to be swiftly discharged through the outlet port 115.

The reactors 181 may be disposed at an upper side of the DC-link capacitors 171. Through this, high heat dissipated during the operation of the reactor 181 is immediately moved upward by convection, thereby effectively suppressing the heat from being transferred to the DC-link capacitors 171.

On the other hand, a bus plate 191 for connecting the polarities P(+), N(−) of the DC-link capacitors 171 may be disposed at one side of the DC-link capacitors 171.

The bus plate 191 may be disposed at a front side region of the DC-link capacitors 171.

The bus plate 191 may be disposed at a lower side of the heat sink 150.

The bus plate 191 may be disposed at a lower side of the heat-dissipating plate 151 of the heat sink 150.

The bus plate 191 may be configured with a rectangular plate shape.

The bus plate 191 may be configured to have a substantially same width as the left and right width of the heat sink 150. Furthermore, the bus plate 191 may be configured to have a height corresponding to that between he enclosure 100 and the bottom plate 121.

An upper end of the bus plate 191 may correspond to a heat-dissipating plate 151 of the heat sink 150 and a lower end thereof may be disposed between the inlet port 122 and the insertion port 124. Through this, the internal space of the enclosure 100 may be partitioned into two spaces in a forward and backward direction by the heat sink 150 and the bus plate 191. Here, a front space of the spaces partitioned by the heat sink 150 and bus plate 191 is the circuit element chamber 102 and a rear space thereof is the air passage 104.

On the other hand, the bus plate 191 may be configured to have a layered structure (stack structure). More specifically, the bus plate 191 may include a P plate 192a connected to the polarity P(+), an N plate 192b connected to the polarity N(−), an intermediate plate 192c, and insulation sheets 192d may be configured to be disposed at one side of each plate 192a-192c.

A plurality of terminals 195 may be provided in a front space partitioned by the bus plate 191. The terminals 195 may be supported by the terminal supporting structure 197. The terminal support supporting structure 197 may be provided with a plurality of insulators (insulation supporter) 198 for supporting the terminals 195 to be insulated.

The bus bars 193 connected to the fuses 162b and SCR/diode modules 162c may be connected to one side of the bus plate 191.

Figure 3:
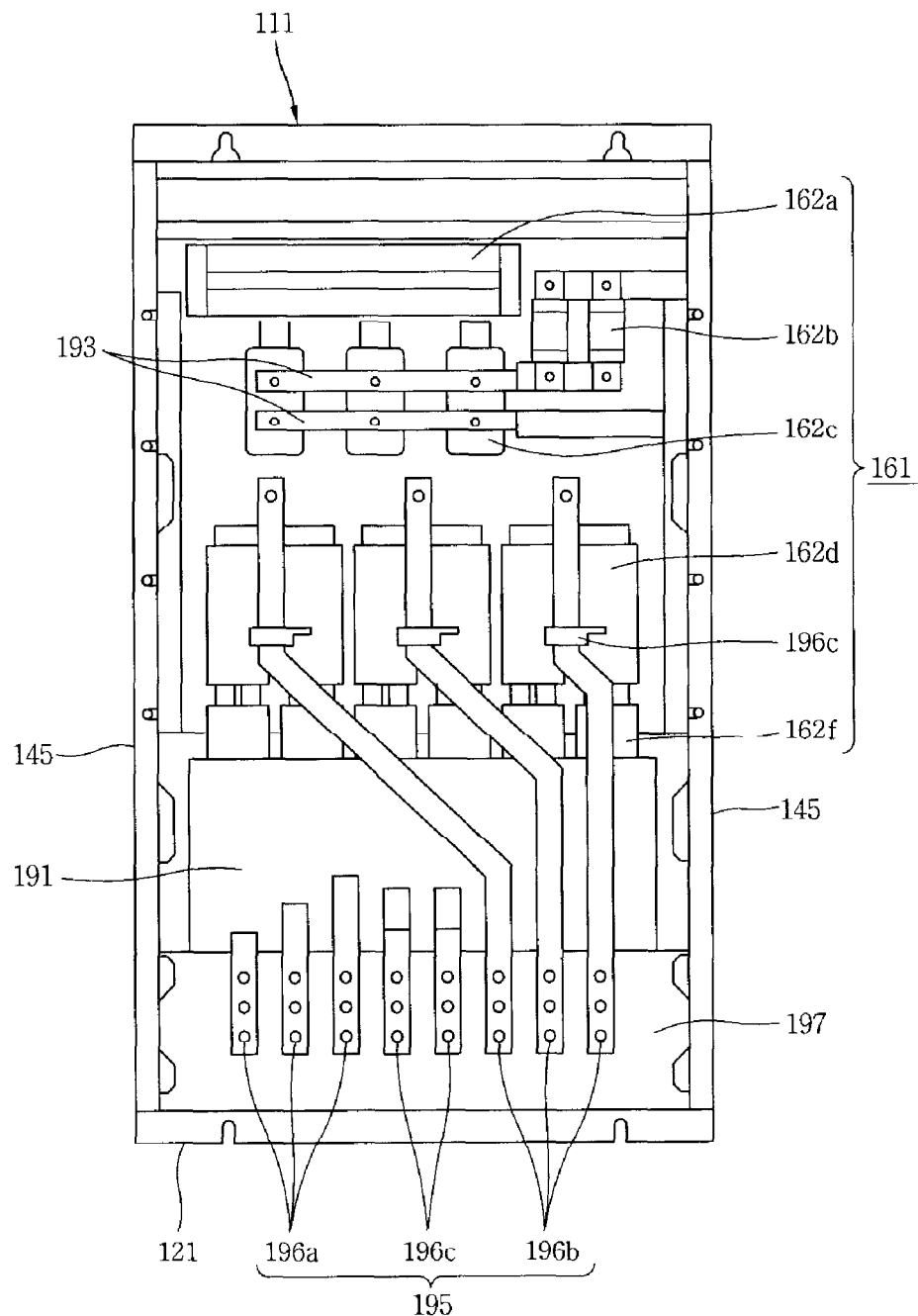
FIG. 3 is plan view of FIG. 2.

The terminals 195, as illustrated in FIG. 3, may include alternate-current terminals 196a, 196b connected to a plurality of input power cables and output power cables, respectively.

Furthermore, the terminals 195 may include direct-current terminals 196c connected to the polarities P(+), N(−) of the DC-link capacitors 171.

More specifically, in this embodiment, there is illustrated a case where the terminals 195 includes three input terminals 196a at the left side of the drawing connected to alternate-current input power cable (not shown), three output terminals 196b at the right side of the drawing connected to alternate-current output power cable (not shown), and two direct-current terminals 196c at the center connected to direct-current wires.

With such a configuration, the DC-link capacitors 171 receives direct-current power to supply the power to the switching element 162d. The switching element 162d receives direct-current power to output alternate-current power with a high-speed switching operation.

The insulated gate bipolar transistor (IGBT) and reactor 181 may generate relatively a lot of heat. At this time, the heat generated from the switching element 162d is transferred to the heat sink 150.

The heat generated by the heat sink 150 and reactor 181 flows upward by convection, thereby effectively suppressing high heat from being transferred to the DC-link capacitors 171.

Furthermore, the heat sink 150 and reactors 181 may be provided at an internal upper region of the enclosure 100 in proximity to the outlet port 115, and thus the heat generated during the operation (working) immediately flows upward by convection and passes through the outlet port 115 to be swiftly discharged to the outside. Through this, it may be possible to effectively suppress an internal temperature of the enclosure 100 from being increased by the heat generated from the switching element 162d and reactors 181.

On the other hand, when the operation is started, power is supplied to the cooling fan 117 to rotate the cooling fan 117. If the cooling fan 117 starts to rotate, then air is inhaled through the inlet port 122, and the inhaled air flows upward along the air passage 104.

The upward flowing air cools the DC-link capacitors 171 while passing between the DC-link capacitors 171. At this time, the temperature of the DC-link capacitors 171 does not have high temperature due to having a relatively smaller heat radiation amount compared to the switching elements and the reactors 181, and as a result, the temperature of the upward flowing air being heat exchanged with the DC-link capacitors 171 does not increase much.

Part of the upward flowing air that passes through the DC-link capacitors 171 is brought into contact with the heat-dissipating plate 151 and heat-dissipating fins 155 of the heat sink 150 to cool the heat sink 150.

Furthermore, the other part of the upward flowing air that passes through the DC-link capacitors 171 cools the reactors 181 while being brought into contact with the reactors 181.

The flow of the air that has cooled the heat sink 150 and reactors 181 is accelerated by the cooling fan 117 to immediately pass through the outlet port 115, and thus the air is swiftly discharged to the outside of the enclosure 100.

As described above, according to an embodiment of the present disclosure, a heat sink mounted with components having a large heat radiation is disposed in proximity to the outlet port, thereby shortening the discharge path of the generated heat. Through this, it may be possible to effectively suppress the internal temperature of the enclosure from being increased.

Furthermore, an internal temperature of the enclosure can be suppressed from being increased, and thus it is possible to use a cooling apparatus having a small capacity, thereby reducing the used power consumption of the cooling apparatus.

Furthermore, the cooling apparatus having a small capacity can be used, thereby reducing the overall size of a device as well as reduce the production cost.

Furthermore, the components (heat sink and reactors) having high heat radiation property are disposed at an internal upper side of the enclosure, and the components (DC-link capacitors) having low heat radiation property are disposed at an internal lower side of the enclosure, and as a result, the heat generated by high heat dissipation components can be swiftly discharged to the outside through the outlet port. Through this, it may be possible to reduce an adverse effect on its neighboring components due to high temperature of the high heat dissipation components, and suppress an internal temperature of the enclosure from being increased.

Furthermore, according to the present invention, taking consideration of the heating relations of the components, high heat components may be disposed at an upper side and low heat components at a lower side, thereby preventing the enforced deterioration and performance degradation of neighboring components due to the high heat of the components. Furthermore, the path of discharging the heat radiation of the high heat components may be shortened, and the capacity of a cooling apparatus can be reduced to allow compact construction, and thus it may be suitable to drive a compressor (motor) such as a chiller system, and the like.

As described above, specific embodiments of the present invention are illustrated and described herein. However, the present invention can be implemented in various embodiments without departing from the spirit or gist of the invention, and thus the foregoing embodiments should not be limited to the content of the detailed description.

Furthermore, the foregoing embodiments should be broadly construed within the scope of the technical spirit defined by the appended claims even though they are not specifically disclosed in the detailed description herein. Moreover, all changes and modifications within the technical scope of the claims and the equivalent scope thereof should be construed to be included in the appended claims.

What is claimed is:

1. An inverter stack, comprising:
   an enclosure on which an inlet port is formed at a lower end thereof and an outlet port is formed at an upper end thereof, the enclosure defining an internal space;
   a heat sink having a switching element, disposed within an upper region of the internal space, the heat sink partitioning the internal space of the enclosure to form an air passage through which air drawn in from the inlet port flows to the outlet port;
   a plurality of DC-link capacitors disposed within the internal space and below the heat sink, and
   a bus plate disposed at a side of the DC-link capacitors to extend the air passage in cooperation with the heat sink, the bus plate connecting the polarities P(+), N(−) of the DC-link capacitors,
   wherein the enclosure comprises a bottom plate disposed at a bottom portion thereof, an upper plate disposed at an upper side of the bottom plate to be separated therefrom by a predetermined distance, a front surface plate, a rear surface plate, and both lateral surface plates disposed to block lateral portions of the bottom plate and upper plate, wherein the heat sink comprises a heat-dissipating plate and a plurality of heat-dissipating fins protruded from one side surface of the heat-dissipating plate and separately disposed in parallel to one another, and the heat-dissipating plate partitions the internal space of the enclosure in a frontward and rearward direction to form the air passage, wherein the bus plate is disposed below the heat-dissipating plate, and a lower end of the bus plate contacts the bottom plate of the enclosure, wherein the heat-dissipating plate and the bus plate partition the internal space of the enclosure into two spaces in a frontward and reward direction, and wherein a front space of the two spaces partitioned by the heat-dissipating plate and the bus plate is a circuit element chamber and a rear space thereof is the air passage through which the air drawn from the inlet port flows to the outlet port.

2. The inverter stack of claim 1, further comprising:
a reactor disposed above the DC-link capacitors within the air passage.

3. The inverter stack of claim 1, wherein the heat-dissipating fins are disposed within the air passage, and the switching element is provided at the other side surface of the heat-dissipating plate.

4. The inverter stack of claim 1, further comprising:
a cooling fan configured to draw in air from the inlet port and discharge the air through the outlet port.

5. The inverter stack of claim 4, wherein the cooling fan is disposed at the outlet port.

6. The inverter stack of claim 1, wherein the DC-link capacitors are vertically disposed in a row.

7. The inverter stack of claim 1, wherein the switching element comprises an insulated gate bipolar transistor.

8. The inverter stack of claim 1, wherein the heat-dissipating plate and heat-dissipating fins can be separated from and assembled with one another.

9. The inverter stack of claim 5, wherein the upper plate comprises a front upper plate, a rear upper plate disposed to be separated from the front upper plate in a forward and backward direction by a different height, and a connecting plate extending downward from a rear edge of the front upper plate to be connected to a front edge of the rear upper plate.

10. The inverter stack of claim 9, wherein the outlet port is formed at the rear upper plate, and wherein the cooling fan is disposed on the rear upper plate.

11. The inverter stack of claim 10, wherein the outlet port is provided in plurality, and wherein the cooling fan is provided in plurality, each of the cooling fans is disposed at each of the outlet ports.

12. The inverter stack of claim 11, wherein the both lateral surface plates and rear surface plate are configured to have upper end portions more protruded by a predetermined length than an upper side of the upper plate, such that the air discharged from the outlet ports is discharged to the upper side thereof without being spread to its surroundings.

* * * * *